(12) United States Patent
Kasai et al.

(10) Patent No.: US 9,199,837 B2
(45) Date of Patent: Dec. 1, 2015

(54) ACOUSTIC SENSOR AND METHOD OF MANUFACTURING THE SAME

(75) Inventors: Takashi Kasai, Kusatsu (JP); Nobuyuki Iida, Hikone (JP); Tomofumi Nakamura, Kusatsu (JP)

(73) Assignee: OMRON Corporation, Kyoto (JP)

( * ) Notice: Subject to any disclaimer, the term of this patent is extended or adjusted under 35 U.S.C. 154(b) by 210 days.

(21) Appl. No.: 13/104,387

(22) Filed: May 10, 2011

(65) Prior Publication Data
US 2011/0278683 A1 Nov. 17, 2011

(30) Foreign Application Priority Data

May 11, 2010 (JP) .................................. 2010-109164

(51) Int. Cl.
*B81B 7/00* (2006.01)
*H04R 19/00* (2006.01)
*H04R 31/00* (2006.01)

(52) U.S. Cl.
CPC ............. *B81B 7/0016* (2013.01); *H04R 19/005* (2013.01); *B81B 2201/0257* (2013.01); *B81B 2207/012* (2013.01); *B81C 2201/053* (2013.01); *H04R 31/00* (2013.01)

(58) Field of Classification Search
CPC .................................................. B06B 1/0292
USPC ............ 438/53; 257/416, E29.324, E21.002; 381/175, 369
See application file for complete search history.

(56) References Cited

U.S. PATENT DOCUMENTS

| | | | |
|---|---|---|---|
| 6,479,878 B1 * | 11/2002 | Okawa et al. .................. 257/415 |
| 6,535,460 B2 * | 3/2003 | Loeppert et al. .............. 367/181 |
| 6,677,176 B2 * | 1/2004 | Wong et al. ...................... 438/50 |
| 7,146,016 B2 * | 12/2006 | Pedersen ........................ 381/175 |
| 7,301,213 B2 * | 11/2007 | Matsubara et al. ............ 257/416 |
| 7,377,175 B2 * | 5/2008 | Matsubara ....................... 73/715 |
| 7,849,648 B2 * | 12/2010 | Tonyan et al. ................ 52/483.1 |
| 7,888,754 B2 * | 2/2011 | Omura et al. .................. 257/419 |

(Continued)

FOREIGN PATENT DOCUMENTS

| JP | 2006-121465 A | 5/2006 |
|---|---|---|
| JP | 2006121465 A * | 5/2006 ............. H04R 19/00 |

(Continued)

OTHER PUBLICATIONS

English translation of JP 2006121465.*

(Continued)

*Primary Examiner* — Jerome Jackson, Jr.
*Assistant Examiner* — Ankush Singal
(74) *Attorney, Agent, or Firm* — Osha Liang LLP

(57) ABSTRACT

In an acoustic sensor, a diaphragm arranged on an upper side of a silicon substrate includes a back chamber, and an anchor supports the diaphragm. An insulating plate portion fixed to an upper surface of the silicon substrate covers the diaphragm with a gap. A conductive fixed electrode film arranged on a lower surface of the plate portion configures a back plate. The change in electrostatic capacitance between the fixed electrode film and the diaphragm outputs to the outside from a fixed side electrode pad and a movable side electrode pad as an electric signal. A protective film is arranged continuously with the plate portion at an outer periphery of the plate portion. The protective film covers the outer peripheral part of the upper surface of the silicon substrate, and the outer periphery of the protective film coincides with the outer periphery of the upper surface of the silicon substrate.

7 Claims, 5 Drawing Sheets

(56) References Cited

U.S. PATENT DOCUMENTS

| | | | |
|---|---|---|---|
| 8,059,842 B2* | 11/2011 | Suzuki et al. | 381/174 |
| 8,067,811 B2* | 11/2011 | Yamaoka et al. | 257/416 |
| 8,081,783 B2* | 12/2011 | Chien et al. | 381/174 |
| 8,138,560 B2* | 3/2012 | Yamaguchi et al. | 257/415 |
| 8,327,711 B2* | 12/2012 | Kasai et al. | 73/662 |
| 2002/0067663 A1* | 6/2002 | Loeppert et al. | 367/181 |
| 2004/0114775 A1* | 6/2004 | Chang | 381/191 |
| 2004/0135144 A1* | 7/2004 | Yamada et al. | 257/59 |
| 2005/0052724 A1* | 3/2005 | Suzuki et al. | 359/305 |
| 2006/0022285 A1* | 2/2006 | Matsubara et al. | 257/416 |
| 2006/0159295 A1* | 7/2006 | Onishi et al. | 381/190 |
| 2006/0169049 A1* | 8/2006 | Matsubara | 73/754 |
| 2006/0291674 A1* | 12/2006 | Gong et al. | 381/175 |
| 2007/0003082 A1* | 1/2007 | Pedersen | 381/191 |
| 2007/0029894 A1* | 2/2007 | Yamaoka et al. | 310/311 |
| 2007/0056377 A1* | 3/2007 | Matsubara | 73/718 |
| 2007/0261910 A1* | 11/2007 | Kasai et al. | 181/142 |
| 2007/0286438 A1* | 12/2007 | Hirade et al. | 381/175 |
| 2007/0291964 A1* | 12/2007 | Chien et al. | 381/174 |
| 2008/0123876 A1* | 5/2008 | Sato et al. | 381/174 |
| 2008/0232615 A1* | 9/2008 | Song et al. | 381/174 |
| 2009/0034760 A1* | 2/2009 | Minamio et al. | 381/175 |
| 2009/0136064 A1* | 5/2009 | Suzuki et al. | 381/174 |
| 2009/0181489 A1* | 7/2009 | Horimoto et al. | 438/53 |
| 2010/0065930 A1* | 3/2010 | Nakatani | 257/415 |
| 2010/0096714 A1 | 4/2010 | Nakatani | |
| 2010/0175477 A1* | 7/2010 | Kasai et al. | 73/649 |
| 2010/0176821 A1* | 7/2010 | Kasai et al. | 324/660 |
| 2011/0179876 A1* | 7/2011 | Kasai et al. | 73/649 |
| 2011/0204745 A1* | 8/2011 | Omura et al. | 310/300 |
| 2011/0278684 A1* | 11/2011 | Kasai | 257/416 |
| 2011/0280419 A1* | 11/2011 | Kasai | 381/176 |

FOREIGN PATENT DOCUMENTS

| | | | | |
|---|---|---|---|---|
| JP | 2007295487 A | | 11/2007 | |
| JP | 2008301434 | | 12/2008 | |
| JP | 2008301434 A | * | 12/2008 | H04R 19/04 |
| JP | 2009-038732 A | | 2/2009 | |
| JP | 2009-147798 A | | 7/2009 | |
| JP | 200989097 A | | 10/2010 | |

OTHER PUBLICATIONS

Korean Examination Report for Application No. 10-2011-0031730, mailed on Mar. 15, 2012, and English translation thereof (6 pages).
Office Action issued in corresponding Japanese Application No. 2010-109164 dated Sep. 25, 2013, and English translation thereof (5 pages).
Office Action issued in corresponding Chinese Application No. 201110119075.8 dated Jan. 20, 2014, and English translation thereof (13 pages).
Extended European Search Report issued in corresponding European Application No. 11161590.2 dated Dec. 18, 2013 (7 pages).

* cited by examiner

PRIOR ART

ACOUSTIC SENSOR AND METHOD OF MANUFACTURING THE SAME

BACKGROUND OF THE INVENTION

1. Technical Field

The present invention relates to acoustic sensors and methods for manufacturing the same, and specifically to a MEMS (Micro Electro Mechanical Systems) type acoustic sensor manufactured using a MEMS technique, and a method for manufacturing the same.

2. Related Art

The MEMS acoustic sensor is disclosed in Japanese Unexamined Patent Publication Nos. 2008-301434 and 2009-89097, for example.

(Regarding Japanese Unexamined Patent Publication No. 2008-301434)

FIGS. 1A and 1B are schematic cross-sectional views showing a state in which an acoustic sensor disclosed in FIG. 7 and FIG. 8 of Japanese Unexamined Patent Publication No. 2008-301434 is mounted in a package. The acoustic sensor 11 has a diaphragm 14 (vibration thin film) laminated on a silicon substrate 12 with a back chamber 13 opened, and a back plate 15 arranged on the silicon substrate 12 to cover the diaphragm 14. Such an acoustic sensor 11 is normally mounted in a package 17 along with an IC circuit 16, as shown in FIGS. 1A and 1B, where an electrode pad 18 of the acoustic sensor 11 and the IC circuit 16 are wire connected with a bonding wire 19, and the IC circuit 16 is wire connected to an electrode section 21 of the package 17 with a bonding wire 20.

In such an acoustic sensor 11, however, the outer peripheral part at the upper surface of the silicon substrate 12 is completely exposed. Therefore, as shown in FIG. 1A, if the bonding wire 19 connecting the acoustic sensor 11 and the IC circuit 16 bends downward due to some kind of load, the bonding wire 19 may come into contact with the silicon substrate 12, thereby causing short circuit in the acoustic sensor 11. Even if the bonding wire 19 is not bent, if a foreign substance 22 (e.g., microscopic dust etc.) gets caught between the bonding wire 19 and the upper surface of the silicon substrate 12 as shown in FIG. 1B, short circuit may occur between the electrode pad 18 and the silicon substrate 12 through the foreign substance 22.

Because the IC circuit 16 is entirely sealed with a resin 23, the bonding wire 19 is fixed by the resin 23 so that the bonding wire 19 does not bend and the foreign substance does not enter, but the acoustic sensor 11 which is the sound receiving unit cannot be sealed with resin as acoustic vibration will be shielded if sealed with resin.

In the acoustic sensor disclosed in FIG. 4 and FIG. 5 of Japanese Unexamined Patent Publication No. 2008-301434, the surface of the silicon substrate is covered with an insulation coating ($SiO_2$ film), but the reliability is low for preventing short circuit because the insulation coating is thin. In the cross-sectional view shown in FIG. 6 of Japanese Unexamined Patent Publication No. 2008-301434, the back plate is extended up to the edge of the silicon substrate. However, this is a view in which the outer peripheral part of the silicon substrate where the upper surface is exposed is omitted, as apparent from the cross-sectional view of FIG. 4 of Japanese Unexamined Patent Publication No. 2008-301434, and the back plate is not actually extended up to the edge of the silicon substrate.

(Regarding Japanese Unexamined Patent Publication No. 2009-89097)

FIG. 2 of Japanese Unexamined Patent Publication No. 2009-89097 discloses an acoustic sensor in which a structural object is arranged up to the outer peripheral edge of the upper surface of the silicon substrate to cover the upper surface of the silicon substrate. In such an acoustic sensor, however, the outer peripheral part of the upper surface of the silicon substrate is covered with a member (surface layer protective film etc.) different from the back plate (plate including upper layer conductive film). The man hours required during manufacturing thus increases, and the productivity is not satisfactory.

SUMMARY

Therefore, one or more embodiments of the present invention protects an outer peripheral part of an upper surface of a silicon substrate with a protective film using a back plate.

According to one or more embodiments of the present invention, there is provided an acoustic sensor including a semiconductor substrate including a back chamber, a conductive diaphragm arranged on an upper side of the semiconductor substrate, an insulating fixed film fixed to an upper surface of the semiconductor substrate so as to cover the diaphragm with a gap, a conductive fixed electrode film arranged on the fixed film at a position facing the diaphragm, and an electrode terminal for outputting a change in electrostatic capacitance between the fixed electrode film and the diaphragm to an outside as an electric signal, wherein an outer peripheral part of the upper surface of the semiconductor substrate is covered by a protective film made from a material identical to the fixed film, and an outer periphery of the protective film coinciding with an outer periphery of the upper surface of the semiconductor substrate.

In the acoustic sensor according to one or more embodiments of the present invention, the thickness of the protective film can be increased and the insulation properties at the outer peripheral part of the upper surface of the semiconductor substrate can be enhanced because the outer peripheral part of the upper surface of the semiconductor substrate to the outer periphery (end edge) is covered with a protective film having insulation properties made from the same material as the fixed film. Therefore, the bonding wire connected to the electrode terminal is prevented from being bent and brought into contact with the upper surface of the semiconductor substrate and the foreign substance is prevented from being caught between the bonding wire and the upper surface of the semiconductor substrate and causing short circuit. Furthermore, because the protective film is made from the same material as the fixed film and the protective film can be formed in the same process as the fixed film, the man hours for manufacturing the acoustic sensor does not increase and the productivity does not lower from arranging the protective film.

In the acoustic sensor according to one or more embodiments of the present invention, at least one part of the protective film is fixed to the surface of the semiconductor substrate with an adhesive layer that is made from a material different from the fixed film and that is thinner than the protective film interposed. Accordingly, the adhesive layer of the thin film thinner than the protective film is formed between the protective film and the semiconductor substrate to reduce the film stress generated at the protective film and alleviate the stripping of the protective film by the film stress. Furthermore, because the protective film is a thin film, the throughput is less likely to lower even when forming a plurality of acoustic sensors on the wafer during the manufacturing process and separating the wafer into individual acoustic sensors by laser dicing at the area where the adhesive layer is formed.

In the acoustic sensor according to one or more embodiments of the present invention, the outer peripheral part of the protective film is fixed to the surface of the semiconductor substrate with the adhesive layer interposed in between, and the inner peripheral part of the protective film is fixed to the surface of the semiconductor substrate with a thick film layer made from a material different from the fixed film interposed in between. Accordingly, the stripping of the protective film can be alleviated, and the throughput is less likely to lower even when individually separating the acoustic sensor formed on the wafer by laser dicing. Furthermore, because the thick film portion is formed at the inner peripheral part and the height of the surface of the protective film is high, an electrode terminal can be arranged at the relevant portion. According to one or more embodiments of the present invention, the thick film layer is formed from a material same as the adhesive layer.

In the acoustic sensor according to one or more embodiments of the present invention, the electrode terminal is arranged on the protective film in the region formed with the thick film layer. Accordingly, the distance between the electrode terminal and the upper surface of the semiconductor substrate can be increased, so that the parasitic capacitance between the electrode terminal and the semiconductor substrate can be reduced, the lowering in sensitivity of the acoustic sensor by the parasitic capacitance can be reduced, and the acoustic characteristics can be enhanced.

In the acoustic sensor according to one or more embodiments of the present invention, the adhesive layer and the thick film layer are formed from an insulating material. Accordingly, the insulation properties between the protective film and the semiconductor substrate can be enhanced.

In the acoustic sensor according to one or more embodiments of the present invention, the protective film and the fixed film are continued, and a boundary region of the protective film and the fixed film is adhered to the upper surface of the semiconductor substrate. Accordingly, the adhesive layer and the thick film layer can be separated from the void portion even if the protective film and the fixed film are continued, thereby facilitating the manufacturing of the acoustic sensor.

According to one or more embodiments of the present invention, there is provided a manufacturing method of an acoustic sensor including a semiconductor substrate including a back chamber, a conductive diaphragm arranged on the upper side of the semiconductor substrate, an insulating fixed film fixed on an upper surface of the semiconductor substrate to cover the diaphragm with a gap, a conductive fixed electrode film arranged on the fixed film at a position facing the diaphragm, and an electrode terminal for outputting a change in electrostatic capacitance between the fixed electrode film and the diaphragm to an outside as an electric signal, the manufacturing method including the steps of forming the diaphragm inside a sacrifice layer deposited on the upper surface of the semiconductor substrate, forming a space shaping portion in which a surface has an inner surface shape of the fixed film by etching the sacrifice layer, forming the fixed film on the shaped sacrifice layer and covering an outer peripheral part of the upper surface of the semiconductor substrate with a protective film made from a material same as the fixed film so that an outer periphery coincides with an outer periphery of the upper surface of the semiconductor substrate, forming the back chamber in the semiconductor substrate, and supporting the diaphragm in space by removing the sacrifice layer by etching and forming a gap between the diaphragm and the inner surface of the fixed film.

In the manufacturing method of the acoustic sensor according to one or more embodiments of the present invention, the thickness of the protective film can be increased and the insulation properties at the outer peripheral part of the upper surface of the semiconductor substrate can be enhanced because the outer peripheral part of the upper surface of the semiconductor substrate to the outer periphery thereof (end edge) is covered with the protective film having insulation properties made from the same material as the fixed film. Therefore, the bonding wire connected to the electrode terminal is prevented from being bent and brought into contact with the upper surface of the semiconductor substrate and the foreign substance is prevented from being caught between the bonding wire and the upper surface of the semiconductor substrate, and causing short circuit. Furthermore, because the protective film is made from the same material as the fixed film and the protective film can be formed in the same process as the fixed film, the manufacturing man hours of the acoustic sensor does not increase and the productivity does not lower from arranging the protective film.

In the manufacturing method of the acoustic sensor according to one or more embodiments of the present invention, an adhesive layer that is made from a material different from the fixed film and that is thinner than the protective film is formed in at least one part of the outer peripheral part of the upper surface of the semiconductor substrate after forming the space shaping portion. In particular, the thickness of the adhesive layer is smaller than an interval between the inner surface of the back plate including the fixed film and the fixed electrode film, and the diaphragm. Accordingly, the adhesive layer of the thin film thinner than the protective film is formed between the protective film and the semiconductor substrate to reduce the film stress generated at the protective film and alleviate the stripping of the protective film by the film stress. Furthermore, because the adhesive layer is a thin film, the throughput is less likely to lower when forming a plurality of acoustic sensors on a wafer during the manufacturing process and then separating the wafer into individual acoustic sensors by laser dicing at the area where the adhesive layer is formed. The adhesive film is arranged separate from the space shaping portion after forming the space shaping portion, and hence, the adhesive film can be easily formed into a thin film.

In the manufacturing method of the acoustic sensor according to one or more embodiments of the present invention, a thick film layer is formed on the outer side of the space shaping portion separate from the space shaping portion by the sacrifice layer and then the adhesive layer is formed on the outer side of the thick film layer when forming the space shaping portion. Accordingly, the thin film layer can be formed from the sacrifice layer at the same time as the space shaping portion, and hence, the manufacturing process of the acoustic sensor can be simplified. The adhesive layer and the thick film layer are formed with the same material.

In the manufacturing method of the acoustic sensor according to one or more embodiments of the present invention, the adhesive layer and the thick film layer are formed from an insulating material. Accordingly, the insulation properties between the protective film and the semiconductor substrate can be enhanced.

In the acoustic sensor according to one or more embodiments of the present invention, the thickness of the thick film layer is greater than an interval between the inner surface of the back plate including the fixed film and the fixed electrode film and the diaphragm. In particular, the thickness of the thick film layer is equal to the distance of the sum of the interval between the inner surface of the back plate including the fixed film and the fixed electrode film and the diaphragm, and the interval between the upper surface of the semiconductor substrate and the diaphragm. Accordingly, the thick film layer can be formed using the sacrifice layer for forming the void portion in the fixed film, so that the manufacturing of the acoustic sensor can be facilitated.

In the manufacturing method of the acoustic sensor according to one or more embodiments of the present invention, the protective film and the fixed film are continuously formed at the same time, and the boundary region of the protective film and the fixed film is adhered to the upper surface of the semiconductor substrate. Accordingly, the adhesive layer and the thick film layer can be separated from the void portion even if the protective film and the fixed film are continued, the adhesive layer and the thick film layer are prevented from being etched when etching the sacrifice layer to form the void portion, and the manufacturing of the acoustic sensor can be facilitated.

DETAILED DESCRIPTION

Hereinafter, embodiments of the present invention will be described with reference to the accompanying drawings. It should be recognized that the present invention is not limited to the following embodiments, and various design changes can be made within a scope not deviating from the gist of the present invention. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Figure 2:
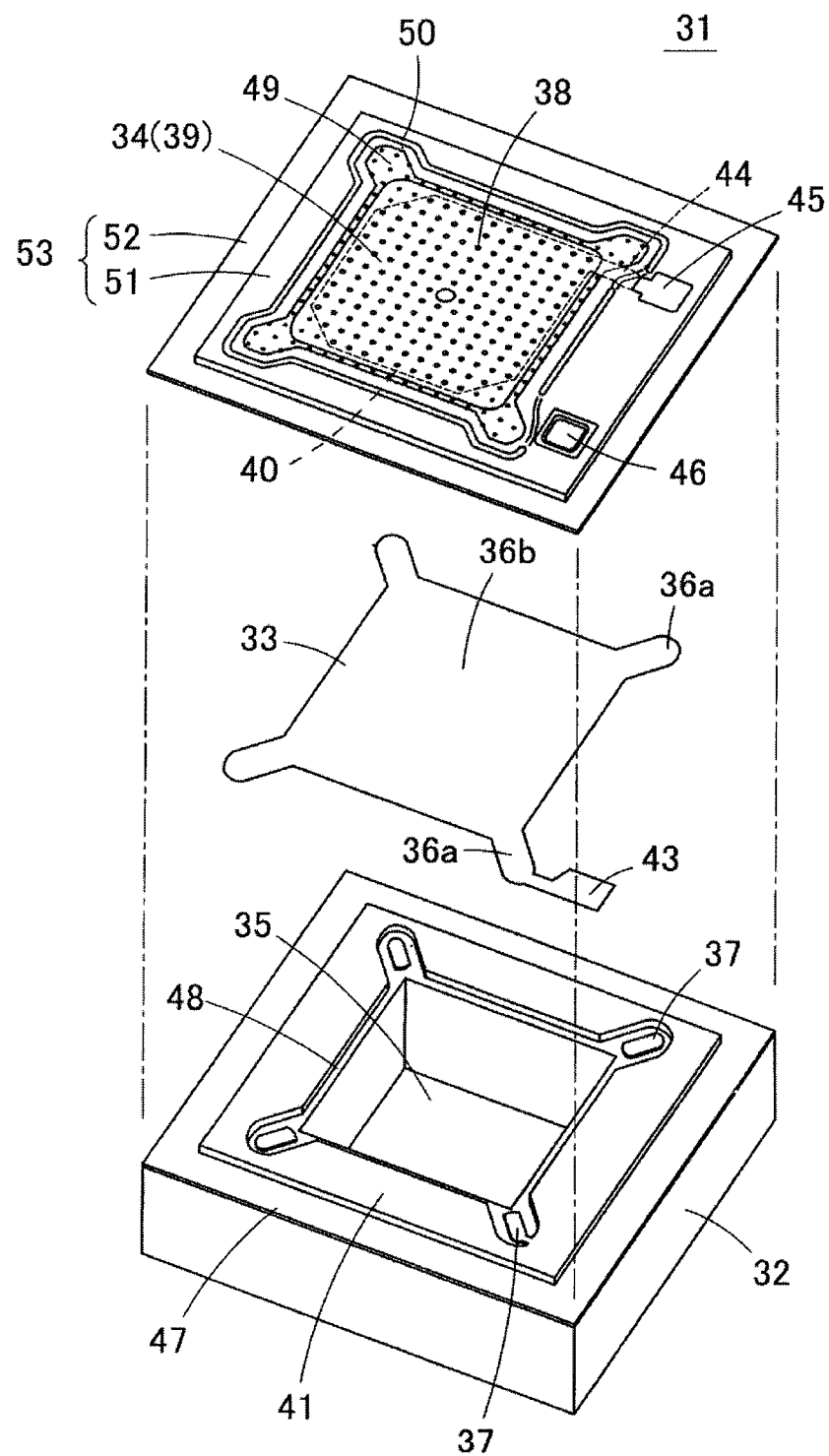
FIG. 2 is an exploded perspective view of an acoustic sensor according to a first embodiment of the present invention.
Figure 3:
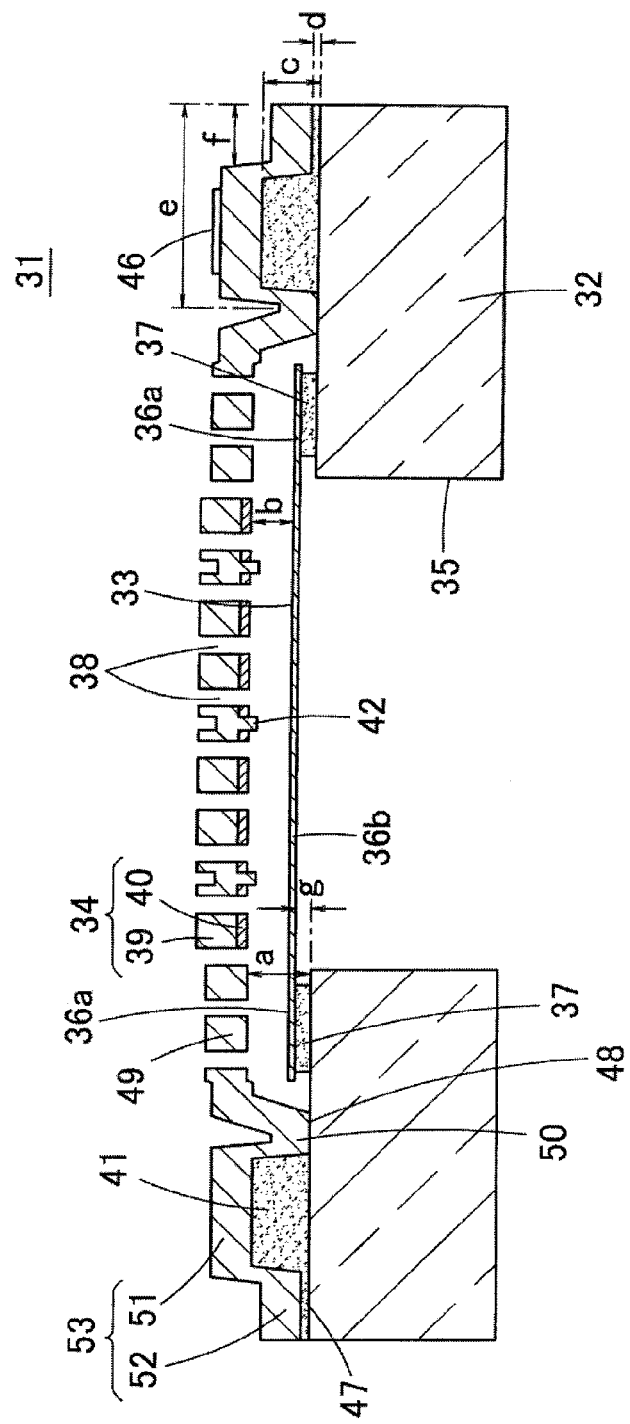
FIG. 3 is a cross-sectional view of the acoustic sensor of the first embodiment.

First, a structure of an acoustic sensor 31 according to a first embodiment of the present invention will be described with reference to FIG. 2 and FIG. 3. FIG. 2 is a perspective view showing the acoustic sensor 31 in a partially exploded manner. FIG. 3 is a cross-sectional view in a diagonal direction showing the structure of the acoustic sensor 31.

The acoustic sensor 31 is a microscopic capacitance type element manufactured using the MEMS technique, where a diaphragm 33 is arranged on an upper surface of a silicon substrate 32 (semiconductor substrate) through an anchor 37, and a back plate 34 is fixed thereon through a microscopic gap (void), as shown in FIG. 3.

Figure 1A:
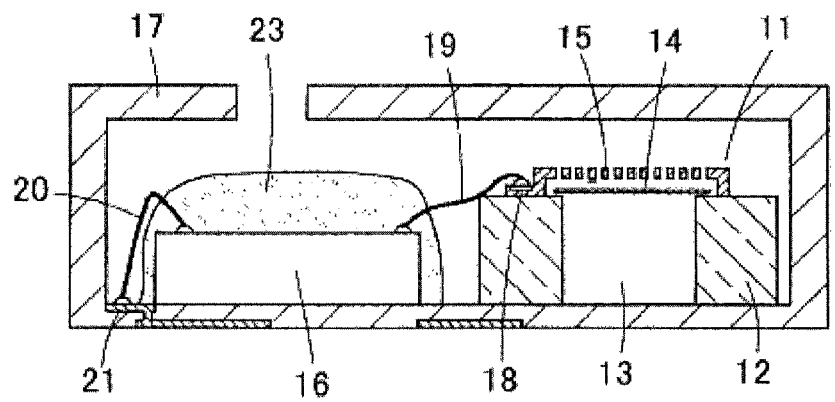
FIGS. 1A and 1B are cross-sectional views showing a state in which an acoustic sensor disclosed in Japanese Unexamined Patent Publication No. 2008-301434 is mounted in a package.
Figure 1B:
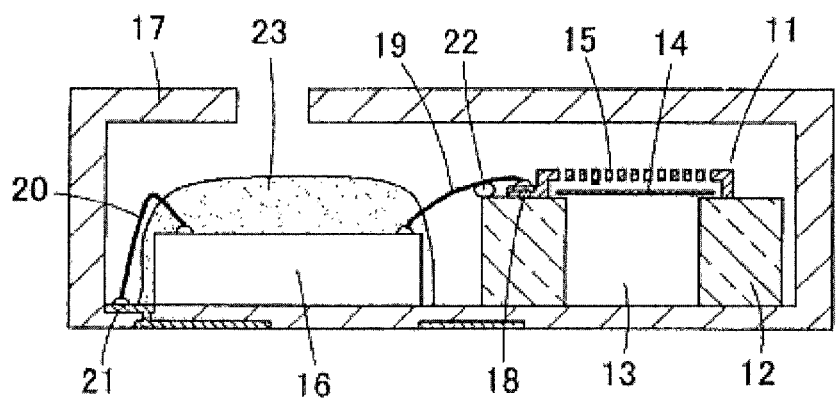

The silicon substrate 32 is made of a monocrystal silicon. As shown in FIG. 2, the silicon substrate 32 is formed to a rectangular shape, and includes a back chamber 35 having a square hole shape that passes from the front surface to the back surface. The inner peripheral surface of the back chamber 35 may be a perpendicular surface or may be inclined to a tapered form. The opening at the lower surface of the back chamber 35 is blocked by a package when the acoustic sensor 31 is mounted in the package (see FIGS. 1A and 1B).

Four anchors 37 for supporting the beam portions 36a of the diaphragm 33 from the lower surface are arranged on the upper surface of the silicon substrate 32, and a base part 41 (thick film layer) is formed to surround the back chamber 35 and the anchors 37. In particular, each of the anchors 37 is positioned within a recessed area formed to cut the inner peripheral edge of the base part 41 in the diagonal direction of the back chamber 35. The region on the outer side of the base part 41 of the upper surface of the silicon substrate 32 is covered by an adhesive layer 47 thinner than the base part 41, where the outer periphery (end edge) of the adhesive layer matches the end edge of the silicon substrate 32. The anchor 37 and the base part 41 are made from $SiO_2$. The adhesive layer 47 is made from $SiO_2$ or polysilicon.

The diaphragm 33 is formed by a polysilicon thin film having a small film thickness, and has conductivity. The diaphragm 33 has the beam portions 36a extended outward in the diagonal direction from four corners of a rectangular vibration thin film 36b. An extraction wiring 43 is extended from one of the beam portions 36a.

As shown in FIG. 3, the diaphragm 33 is arranged on the upper surface of the silicon substrate 32 so that the vibration thin film 36b covers the upper surface of the back chamber 35. Each of the beam portions 36a of the diaphragm 33 is positioned in the recessed area of the base part 41, and the lower surface of the distal end of each beam portion 36a is fixed to the anchor 37. Therefore, the vibration thin film 36b of the diaphragm 33 floats in the air at the upper side of the back chamber 35, and film vibrates in response to the acoustic vibration (air vibration).

The back plate 34 is formed by arranging a fixed electrode film 40 made of polysilicon on the lower surface of a plate portion 39 (fixed film) made of nitride film (SiN). The back plate 34 has a canopy shape and includes a hollow portion underneath, and covers the diaphragm 33. The height a (height from the upper surface of the silicon substrate 32 to the lower surface of the fixed electrode film 40) of the hollow portion under the back plate 34 is equal to the thickness c of the base part 41 formed at the upper surface of the silicon substrate 32. A microscopic void is formed between the lower surface of the back plate 34 (i.e., lower surface of fixed electrode film 40) and the upper surface of the diaphragm 33. A beam portion cover region 49 arranged at the corner of the back plate 34 covers the beam portion 36a through the microscopic void. The fixed electrode film 40 faces the vibration thin film 36b which is the movable electrode film and configures a capacitor.

The back plate 34 has a great number of acoustic holes 38 for passing the acoustic vibration perforated so as to pass from the upper surface to the lower surface. A small gap (passage of acoustic vibration) is also formed between the lower surface at the outer peripheral part of the vibration thin film 36b and the upper surface of the silicon substrate 32. Therefore, the acoustic vibration that entered the back plate 34 through the acoustic holes 38 vibrates the vibration thin film 36b, and also exits to the back chamber 35 through the gap between the outer peripheral part of the vibration thin film 36b and the silicon substrate 32.

A great number of microscopic stoppers 42 are projected out at the inner surface of the back plate 34 to prevent the diaphragm 33 from being adsorbed or attached (stuck) to the lower surface of the back plate 34 and not returning.

A protective film 53 is continuously extended over the entire periphery from the outer peripheral edge of the canopy shaped plate portion 39. Therefore, the protective film 53 is made from a nitride film (SiN) same as the plate portion 39, and has substantially the same film thickness as the plate portion 39. The inner peripheral part of the protective film 53 is a base covering part 51 having a reverse groove shaped cross-section, where the outer peripheral part of the protective film 53 is a flat part 52. A boundary region 50 between the outer periphery of the back plate 34 and the inner periphery of the protective film 53 has a V groove shaped cross-section.

The back plate 34 is fixed to the upper surface of the silicon substrate 32, and the protective film 53 covers the outer peripheral part of the upper surface of the silicon substrate 32 with the base part 41 and the adhesive layer 47 interposed in between. The base covering part 51 of the protective film 53 covers the base part 41 and the flat part 52 covers the upper surface of the adhesive layer 47, where the outer periphery (end edge) of the flat part 52 coincides with the outer periphery of the adhesive layer 47 and the outer periphery of the upper surface of the silicon substrate 32. The lower surface of the boundary region 50 between the back plate 34 and the protective film 53 is adhered to the exposed surface 48 of the inner periphery of the base part 41, where the hollow portion under the back plate 34 and the base part 41 are separated by the boundary region 50.

The thickness b of the void (air gap) between the upper surface of the diaphragm 33 and the lower surface of the back plate 34 is about 2 μm. The thickness c of the base part 41 is greater than the thickness b of the void between the anchor 37 and the back plate 34 and is greater than or equal to 2 μm. The thickness d of the adhesive layer 47 is smaller than the thickness b of the void between the anchor 37 and the back plate 34, and is smaller than or equal to 2 μm. According to one or more embodiments of the present invention, the width e of the protective film 53 is smaller than or equal to 400 μm, and the width f of the flat part 52 is about 150 μm.

An opening is formed in the base covering part 51, where a movable side electrode pad 46 (electrode terminal) is formed on the upper surface of the extraction wiring 43 through the relevant opening, and such a movable side electrode pad 46 is conducted to the extraction wiring 43 (therefore to the diaphragm 33). A fixed side electrode pad 45 (electrode terminal) arranged on the upper surface of the plate portion 39 is conducted to the extraction wiring 44 (therefore to the fixed electrode film 40) through a through-hole and the like.

In such an acoustic sensor 31, the diaphragm 33, which is a thin film, is excited by the acoustic vibration, and the film vibrates when the acoustic vibration passes through the acoustic hole 38 and enters the space between the back plate 34 and the diaphragm 33. When the diaphragm 33 vibrates and the gap distance between the diaphragm 33 and the fixed electrode film 40 changes, the electrostatic capacitance between the diaphragm 33 and the fixed electrode film 40 changes. As a result, in such an acoustic sensor 31, the acoustic vibration (change in sound pressure) sensed by the diaphragm 33 becomes the change in electrostatic capacitance between the diaphragm 33 and the fixed electrode film 40, and is outputted as an electrical signal.

According to such an acoustic sensor 31, the outer peripheral part of the upper surface of the silicon substrate 32 (region to cut from the wafer and sometimes referred to as a dicing street part) is covered by the flat part 52 of the protective film 53. Similar to the plate portion 39, the protective film 53 is formed by an SiN film and is formed to a relatively thick film thickness, and thus excels in insulation properties. Therefore, the bonding wire merely touches the protective film 53 and does not directly touch the silicon substrate 32 even if the bonding wire connected to the fixed side electrode pad 45 and the movable side electrode pad 46 is bent and sagged downward. Furthermore, even if a foreign substance gets caught under the bonding wire, such a foreign substance is shielded by the protective film 53 and thus does not directly touch the silicon substrate 32. The short circuit of the acoustic sensor 31 thus can be effectively prevented.

The adhesive layer 47 is made from a thin $SiO_2$ or a polysilicon thinner than the thickness b of the void, and the flat part 52 is formed on the upper surface of the silicon substrate 32 through the adhesive layer 47, and hence, the film stress generated at the protective film 53 can be reduced and the stripping of the protective film 53 due to the film stress can be alleviated. The adhesiveness of the flat part 52 can be enhanced by interposing the adhesive layer 47 made of $SiO_2$ or SiN.

The base part 41 is made of $SiO_2$ thicker than the thickness b of the void, and the fixed side electrode pad 45 is arranged on the protective film 53 (base covering part 51) at the upper side of the base part 41, so that the distance between the fixed side electrode pad 45 and the upper surface of the silicon substrate 32 can be increased. As a result, the parasitic capacitance between the electrode pads 45, 46 and the silicon substrate 32 can be reduced, whereby the lowering in sensitivity of the acoustic sensor 31 by the parasitic capacitance can be reduced, and the acoustic characteristics of the acoustic sensor 31 can be enhanced. Furthermore, the adhesiveness of the base covering part 51 can be enhanced because the base covering part 51 is formed on the base part 41 made of $SiO_2$.

In the example of FIG. 2, the effect of reducing the parasitic capacitance cannot be obtained by thickening the base part 41 because the movable side electrode pad 46 is formed at the end of the beam portion 36a of the diaphragm 33. However, the effect of reducing the parasitic capacitance by thickening the base part 41 can be obtained by adopting a structure similar to the fixed side electrode pad 45 for the movable side electrode pad 46, that is, by arranging the extraction wiring on the upper surface of the plate portion 39 through the through-hole and the like to achieve conduction.

Furthermore, satisfactory moisture absorption resistance is obtained because the acoustic sensor 31 has the outermost surface covered with the SiN layer (i.e., plate portion 39 and protective film 53) having high moisture absorption resistance.

(Manufacturing Method of Acoustic Sensor)

The manufacturing method by the MEMS technique of the acoustic sensor 31 will now be described. FIGS. 4A to 4D and FIGS. 5A to 5C are schematic cross-sectional views showing the manufacturing process of the acoustic sensor 31.

Figure 4A:
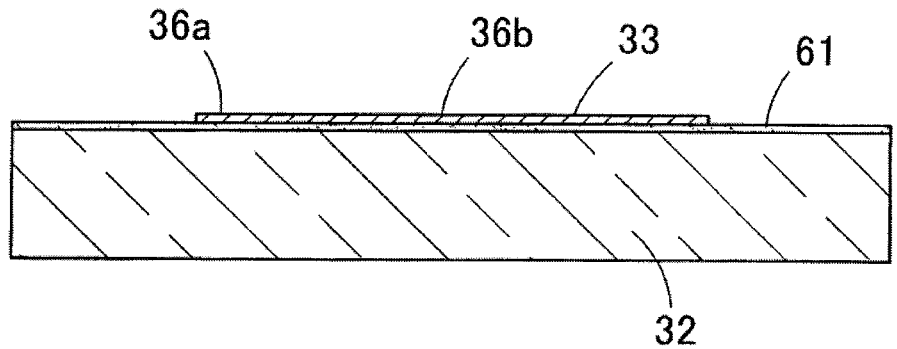
FIGS. 4A to 4D are schematic cross-sectional views describing the manufacturing process of the acoustic sensor of the first embodiment.

First, as shown in FIG. 4A, a sacrifice layer 61 made of silicon oxide film ($SiO_2$) is formed on the surface of the monocrystal silicon substrate 32 through thermal oxidation, CVD method, and the like. A polysilicon layer is then formed on the sacrifice layer 61, which polysilicon layer is patterned by etching to form a flat diaphragm 33 in which the beam portions 36a are extended from four corners of the vibration thin film 36b.

Figure 4B:
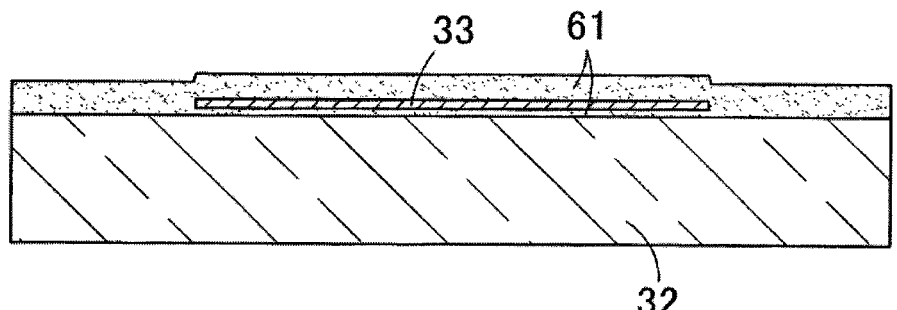

A sacrifice layer 61 is further deposited on the sacrifice layer 61 from above the diaphragm 33 to cover the diaphragm 33 with the sacrifice layer 61, so that the diaphragm 33 is embedded in the sacrifice layer 61 as shown in FIG. 4B.

Figure 4C:
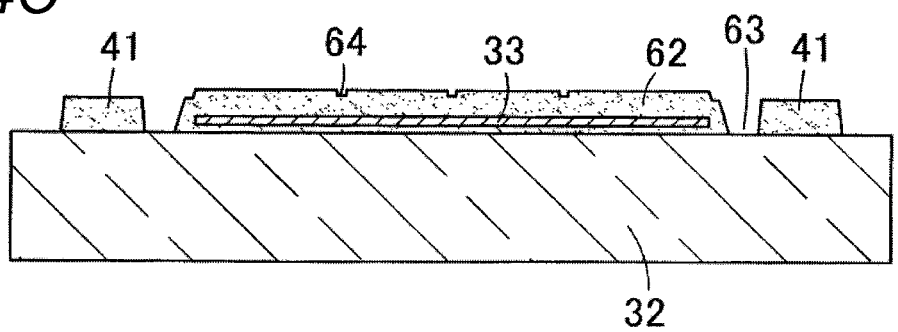

Then, as shown in FIG. 4C, the sacrifice layer 61 is etched to form a void shaped portion 62 having the inner surface shape of the back plate 34 and the base part 41 from the sacrifice layer 61. In this case, the void shaped part 62 and the base part 41 are separated by a groove 63, and the upper surface of the silicon substrate 32 is exposed in the groove 63 (bottom surface of the groove 63 becomes the exposed surface 48) and the upper surface of the silicon substrate 32 is exposed even on the outer side of the base part 41. A hole 64 for forming the stopper 42 is dug at the upper surface of the void shaped part 62.

Subsequently, the thin adhesive layer 47 is formed by $SiO_2$ or polysilicon so as to continue to the outer peripheral surface of the base part 41 at the upper surface of the silicon substrate 32 on the outer side of the base part 41.

Figure 5A:
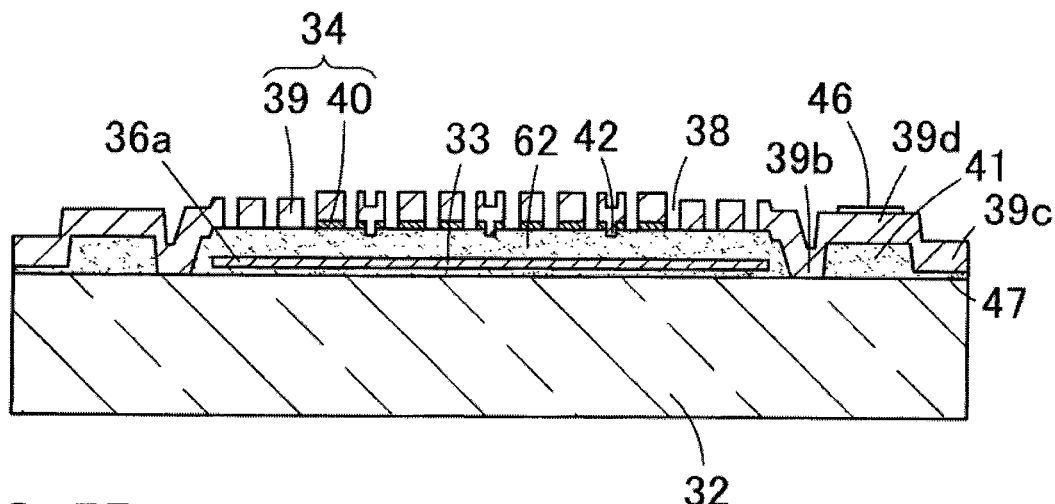
FIGS. 5A to 5C are schematic cross-sectional views describing the manufacturing process of the acoustic sensor of the first embodiment, showing the process following FIG. 4D.

As shown in FIG. 5A, a polysilicon film is formed on the upper surface of the void shaped part 62, and the polysilicon film is patterned by etching to form the fixed electrode film 40. In this case, the acoustic hole 38 is opened in the fixed electrode film 40 and the through hole is opened in accordance with the hole 64. Furthermore, an SiN layer having a hydrofluoric acid resistance property is deposited from above the fixed electrode film 40 to form the plate portion 39. In this case, the stopper 42 for preventing fixed attachment is formed by the SiN layer deposited in the hole 64. The acoustic hole 38 is also formed in the plate portion 39 in alignment with the acoustic hole 38 of the fixed electrode film 40, and the acoustic hole 38 is also passed through the back plate 34. Furthermore, the electrode pads 45, 46 are arranged on the base covering part 51.

Figure 5B:
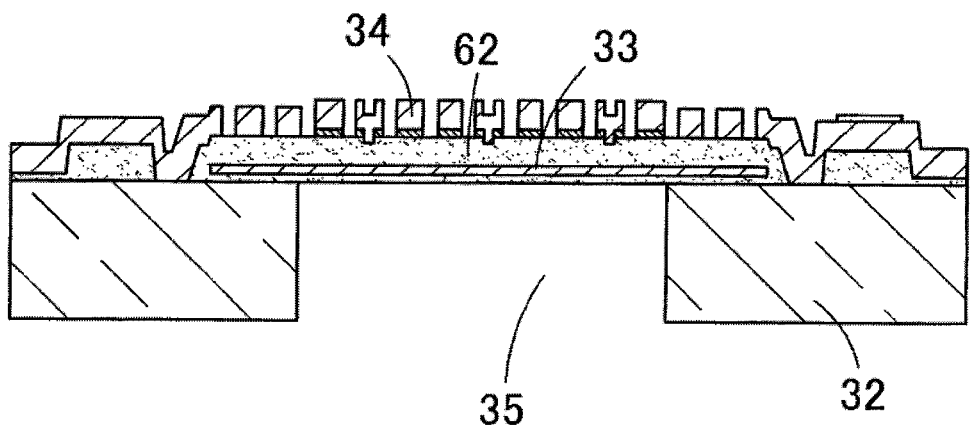

After the back plate 34 is completed in such a manner, the central part of the silicon substrate 32 is etched from the lower surface side, and the back chamber 35 is passed through the silicon substrate 32 as shown in FIG. 5B to expose the void shaped part 62 at the upper surface of the back chamber 35.

Figure 5C:
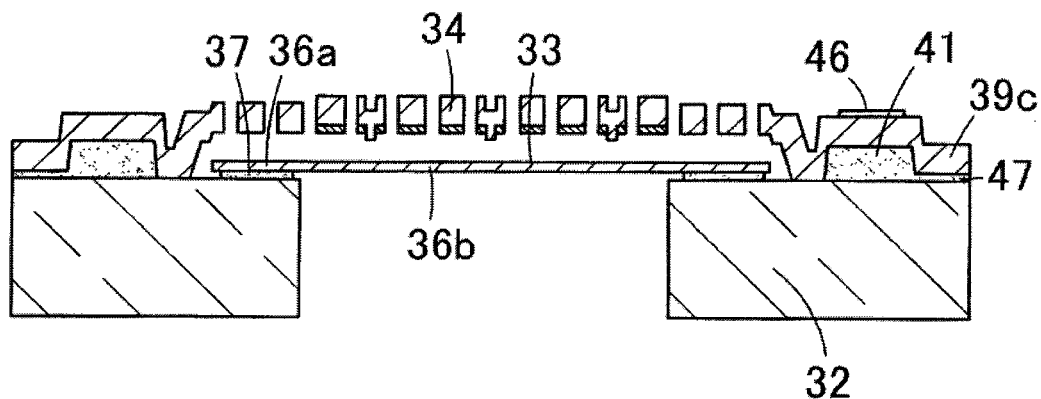

Thereafter, the hydrofluoric acid is introduced from the acoustic hole 38 of the back plate 34, the back chamber 35 of the silicon substrate 32, and the like to selectively wet etch the void shaped part 62, and the void shaped part 62 is removed leaving only the sacrifice layer 61 under the beam portion 36a as the anchor 37 as shown in FIG. 5C. As a result, the diaphragm 33 floats from the upper surface of the silicon substrate 32 by the anchor 37, and supported so as to vibrate on the back chamber 35, whereby an air gap forms between the fixed electrode film 40 and the diaphragm 33. Because the base part 41 and the void shaped part 62 are partitioned by the boundary region 50, the base part 41 is not etched with the hydrofluoric acid, and the base part 41 and the adhesive layer 47 remain as is. The acoustic sensor 31 is formed in such a manner.

The thickness of the base part 41 is made larger than the thickness b of the void between the upper surface of the diaphragm 33 and the lower surface of the back plate 34 in the acoustic sensor 31 for the following reasons in terms of method. The productivity becomes the most satisfactory if the base part 41 is formed from the same sacrifice layer 61 through the same process as the void shaped part 62 as in the manufacturing method described. To obtain such a method, the thickness c of the base part 41 needs to be thicker than the thickness b of the void (c≥b).

If the void between the diaphragm 33 and the back plate 34 is narrowed, according to one or more embodiments of the present invention, such a void is as wide as possible to prevent the pull in phenomenon (phenomenon in which the diaphragm 33 and the fixed electrode film 40 attach due to electrostatic attractive force at the time of voltage application), the stick phenomenon (phenomenon in which the diaphragm 33 and the fixed electrode film 40 attach due to moisture etc. that entered the void), and the like. According to one or more embodiments of the present invention, the void is also as wide as possible to reduce the heat noise that becomes the noise source. The void between the diaphragm 33 and the back plate 34 thus cannot be made thinner than or equal to 2 μm, and the thickness b of the void is generally greater than or equal to 2 μm.

According to one or more embodiments of the present invention, the base part 41 is as thick as possible to reduce the parasitic capacitance between the fixed side electrode pad 45 and the silicon substrate 32. The base part 41 can ensure a constant thickness or more (i.e., thickness of greater than or equal to 2 μm) by having the thickness c of the base part 41 greater than the thickness b of the void, and hence the parasitic capacitance can obviously be reduced. According to one or more embodiments of the present invention, the thickness c of the base part 41 is the same as the total of the thickness b of the void and the thickness g of the anchor 37. Accordingly, the process of forming the base part 41 and the process of forming the void or anchor thickness are synchronized, whereby the thickness c of the base part 41 becomes equal to the total of the thickness c of the void and the thickness g of the anchor 37.

Figure 4D:
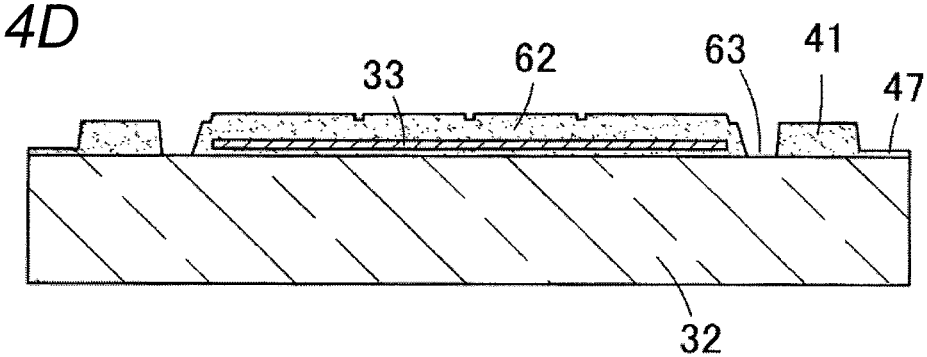

The thickness of the adhesive layer 47 is formed smaller than the thickness b of the void between the upper surface of the diaphragm 33 and the lower surface of the back plate 34 for the following reasons in terms of method. According to one or more embodiments of the present invention, the adhesive layer 47 arranged on the dicing street part has a thin thickness when using laser dicing. However, the thickness of the adhesive layer 47 becomes thick when simultaneously forming the adhesive layer 47 using the sacrifice layer 61 for forming the void shaped part 62 and the base part 41. Therefore, the adhesive layer 47 is formed in a process different from the base part 41 and the void shaped part 62, as shown in FIG. 4D. According to one or more embodiments of the present invention, the thickness d of the adhesive layer 47 formed in the process of FIG. 4D is as thin as possible, and hence is formed from an $SiO_2$ film having a thickness of about 0.1 μm.

The adhesive layer 47 is formed in the process after the void shaped part 62 and the base part 41 are formed, so that the same film as the adhesive layer 47 is sometimes applied to the surface of the void shaped part 62 and the base part 41 depending on the method of forming the adhesive layer 47. As a result, the thickness of the void shaped part 62 and the base part 41 increases by the thickness of the adhesive layer 47. In such a case, the thickness of the sacrifice layer 61 formed in the process of FIG. 4B is made thinner than the target thickness of the void shaped part 62 and the base part 41 by the thickness of the adhesive layer 47.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A manufacturing method of an acoustic sensor, wherein the acoustic sensor comprises:
    a semiconductor substrate comprising a back chamber;
    a conductive diaphragm arranged on an upper side of the semiconductor substrate through anchors;
    an insulating fixed film fixed on an upper surface of the semiconductor substrate to cover the conductive diaphragm with a gap;
    a conductive fixed electrode film arranged on the insulating fixed film at a position facing the conductive diaphragm; and
    an electrode terminal that outputs a change in electrostatic capacitance between the conductive fixed electrode film and the conductive diaphragm to an outside as an electric signal, wherein the manufacturing method comprises:
- forming the conductive diaphragm inside a sacrifice layer deposited on the upper surface of the semiconductor substrate;
- forming a space shaping portion in which a surface comprises an inner surface shape of the insulating fixed film by etching the sacrifice layer;
- forming a thick film layer on an outer side of the space shaping portion separate from the space shaping portion by etching the sacrifice layer;
- forming the insulating fixed film on the space shaping portion of the sacrifice layer to cover an outer peripheral part of the upper surface of the semiconductor substrate with a protective film made from a material identical to the insulating fixed film so that an outer periphery of the protective film coincides with an outer periphery of the upper surface of the semiconductor substrate;
- forming the back chamber in the semiconductor substrate; and
- supporting the conductive diaphragm in space by removing the sacrifice layer by etching and forming a gap between the conductive diaphragm and the inner surface of the insulating fixed film, wherein an adhesive layer that is made from a material different from the insulating fixed film and that is thinner than the protective film is formed on an outer side of the thick film layer after forming the space shaping portion.

2. The manufacturing method of the acoustic sensor according to claim 1, wherein the adhesive layer and the thick film layer are formed from the same material.

3. The manufacturing method of the acoustic sensor according to claim 1, wherein the adhesive layer and the thick film layer are formed from an insulating material.

4. The manufacturing method of the acoustic sensor according to claim 1, wherein a thickness of the adhesive layer is smaller than an interval between an inner surface of a back plate comprising the insulating fixed film and the conductive fixed electrode film and the conductive diaphragm.

5. The manufacturing method of the acoustic sensor according to claim 1, wherein a thickness of the thick film layer is greater than an interval between an inner surface of a back plate comprising the insulating fixed film and the conductive fixed electrode film and the conductive diaphragm.

6. The manufacturing method of the acoustic sensor according to claim 1, wherein the thickness of the thick film layer is equal to a distance of a sum of an interval between an inner surface of a back plate comprising the insulating fixed film and the conductive fixed electrode film and the conductive diaphragm, and an interval between the upper surface of the semiconductor substrate and the conductive diaphragm.

7. The manufacturing method of the acoustic sensor according to claim 1,
- wherein the protective film and the insulating fixed film are continuously formed at the same time, and
- wherein a boundary region of the protective film and the insulating fixed film is adhered to the upper surface of the semiconductor substrate.

* * * * *